United States Patent
Cho et al.

(10) Patent No.: US 7,804,726 B2
(45) Date of Patent: Sep. 28, 2010

(54) APPARATUSES AND METHODS FOR MULTI-BIT PROGRAMMING

(75) Inventors: Kyoung Lae Cho, Yongin-si (KR); Jun Jin Kong, Yongin-si (KR); Jong Han Kim, Suwon-si (KR); Seung Hoon Lee, Seoul (KR); Young Hwan Lee, Suwon-si (KR); Sung-Jae Byun, Yongin-si (KR); Ju Hee Park, Guri-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 103 days.

(21) Appl. No.: 12/073,100

(22) Filed: Feb. 29, 2008

(65) Prior Publication Data

US 2009/0091991 A1   Apr. 9, 2009

(30) Foreign Application Priority Data

Oct. 8, 2007   (KR) .................... 10-2007-0101061

(51) Int. Cl.
*G11C 7/22* (2006.01)
(52) U.S. Cl. ...................... 365/189.16; 365/185.03; 365/185.14
(58) Field of Classification Search ............ 365/185.14, 365/185.28, 189.05, 185.03
See application file for complete search history.

(56) References Cited

U.S. PATENT DOCUMENTS

| 2004/0213047 | A1  | 10/2004 | Crippa et al.             |
| 2006/0279989 | A1* | 12/2006 | Seong et al. ... 365/185.03 |
| 2007/0002615 | A1  | 1/2007  | Lee et al.                |
| 2007/0002623 | A1  | 1/2007  | Won et al.                |
| 2007/0002629 | A1  | 1/2007  | Lee et al.                |
| 2007/0019468 | A1  | 1/2007  | Seong et al.              |
| 2008/0043543 | A1* | 2/2008  | Chen et al. ... 365/189.15 |
| 2008/0049497 | A1  | 2/2008  | Mo                        |

FOREIGN PATENT DOCUMENTS

KR   100769770 B1   10/2007

OTHER PUBLICATIONS

International Search Report (dated Jun. 20, 2008) for counterpart International Application No. PCT/KR2008/001826 is provided the purposes of certification under 37 C.F.R. §§ 1.97(e) and 1.704(d).
Written Opinion (dated Jun. 20, 2008) for counterpart International Application No. PCT/KR2008/001826 is provided the purposes of certification under 37 C.F.R. §§ 1.97(e) and 1.704(d).

* cited by examiner

*Primary Examiner*—Hoai V Ho
*Assistant Examiner*—Anthan T. Tran
(74) *Attorney, Agent, or Firm*—Harness, Dickey & Pierce, P.L.C.

(57) ABSTRACT

Multi-bit programming apparatuses and methods are provided. A multi-bit programming apparatus includes a page buffer configured to store first data of the page programming operation, an input control unit configured to determine whether to invert the first data based on a number of bits having a first value and a number of bits having a second value. The input control unit is further configured to invert the first data to generate second data if the number of bits having a first value is greater than the number of bits having a second value and store the second data in the page buffer. The multi-bit programming apparatus further includes a page programming unit configured to program the second data stored in the page buffer in at least one multi-bit cell.

16 Claims, 13 Drawing Sheets

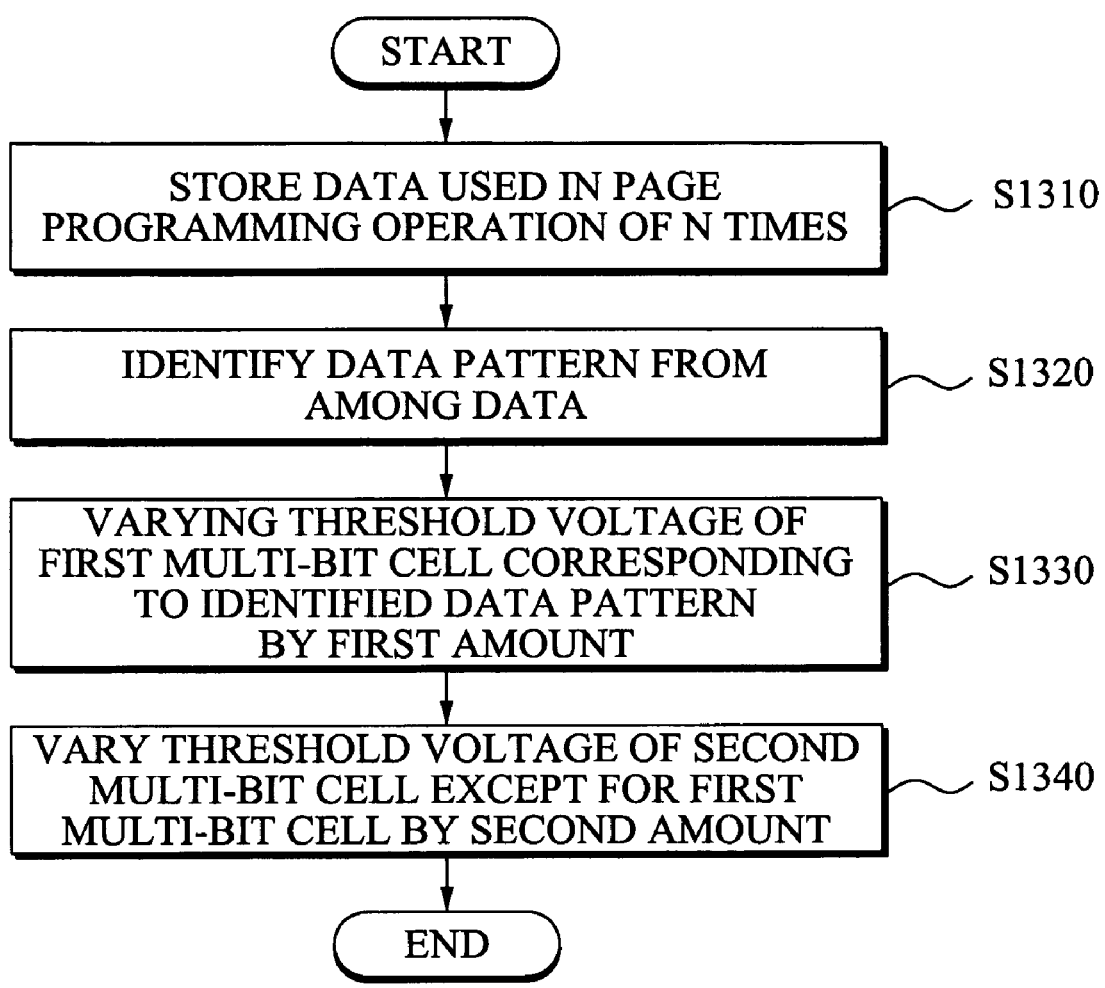

APPARATUSES AND METHODS FOR MULTI-BIT PROGRAMMING

PRIORITY STATEMENT

This application claims priority under 35 U.S.C. §119 to Korean Patent Application No. 10-2007-0101061, filed on Oct. 8, 2007, in the Korean Intellectual Property Office (KIPO), the entire contents of which are incorporated herein by reference.

BACKGROUND

Description of Related Art

A conventional single-level cell (SLC) memory device (referred to as a single-bit cell (SBC) memory) stores one bit of data in a single memory cell. An SLC memory stores and reads one-bit data at a voltage level included in two distributions divided by a threshold voltage level programmed in a memory cell. The programmed threshold voltage may have a distribution within a given range due to electrical characteristic differences between the SLC memories.

In this example, when a voltage level read from the memory cell is between about 0.5V and 1.5V, inclusive, the data stored in the memory cell is determined to have a logic value of "1". When the voltage level read from the memory cell is between about 2.5V and 3.5V, inclusive, the data stored in the memory cell is determined to have a logic value of "0". The data stored in the memory cell is classified based on the difference between cell currents and/or cell voltages during the reading operations.

A conventional multi-level cell (MLC) memory device (also referred to as a multi-bit cell (MBC) memory) stores multi-bit data (e.g., data of two or more bits) in a single memory cell. However, as the number of bits stored in a single memory cell increases, reliability may deteriorate and/or read-failure rates may increase.

For example, to store 'm' bits in a single memory cell, $2^m$ voltage level distributions are required. But, because the voltage window for each memory cell is limited, the difference in threshold voltage between adjacent bits decreases as 'm' increases, causing the read-failure rate to increase. For this reason, improving storage density using a MLC memory device may be relatively difficult.

SUMMARY

Example embodiments relate to apparatuses and/or methods for programming data in memory devices. Example embodiments also relate to multi-bit (multi-level) programming apparatuses and/or methods for programming data in multi-level memory devices. Example embodiments also provide computer readable mediums storing computer executable instructions that, when executed, cause a computer to perform methods according to example embodiments.

Example embodiments may provide apparatuses and/or methods that apply a multi-level (multi-bit) programming scheme in a multi-level cell (MLC) memory device. The programming schemes discussed herein may control a distribution of a threshold voltage more precisely when storing data.

Example embodiments provide apparatuses and/or methods that apply a multi-level (multi-bit) programming scheme in an MLC memory device, which may reduce changes in a threshold voltage caused by, for example, floating poly-silicon (FP) coupling, which may reduce data corruption of adjacent multi-level cells, and/or reduce read failure rates of data stored in the MLC memory device.

Example embodiments also provide apparatuses and/or methods that apply a multi-level (multi-bit) programming scheme in an MLC memory device that may reduce disturbances when storing data.

At least one example embodiment provides a multi-bit programming apparatus for performing a page programming operation N times. According to at least this example embodiment, a page buffer may be configured to store first data of the page programming operation. The first data may include at least one bit of data. An input control unit may be configured to determine whether inversion of the first data occurs based on a number of '1's and '0's from among the first data including at least one bit, generate second data depending on the determined occurrence of the inversion, and store the second data in the page buffer. A page programming unit may be configured to program the second data stored in the page buffer in at least one multi-bit cell.

At least one other example embodiment provides a multi-bit programming apparatus for performing a plurality of page programming operations. The apparatus may include a page buffer, an input control unit and a page programming unit. The page buffer may be configured to store first data of a first of a plurality of page programming operations. The first data may include at least one bit. An input control unit may be configured to determine whether to invert the first data based on a number of bits having a first value and a number of bits having a second value in the first data, invert the first data to generate second data if the number of bits having the first value is greater than the number of bits having the second value, and store the second data in the page buffer. The page programming unit may be configured to program the second data stored in the page buffer in at least one multi-bit cell.

At least one other example embodiment provides a multi-bit programming apparatus for performing a page programming operation N times. According to at least this example embodiment, a memory may be capable of storing data for the N page programming operations. A data pattern identification unit may be configured to identify a data pattern from the data. A page programming unit may be configured to program first data from among the data in a first multi-bit cell corresponding to the identified data pattern by varying a threshold voltage of the first multi-bit cell by a first amount, and program second data from among the data in a second multi-bit cell by varying a threshold voltage of the second multi-bit cell by a second amount. The first and second data may be different, the first and second multi-bit cells may be different and/or the first and second amounts may be different.

At least one other example embodiment provides a multi-bit programming apparatus. The apparatus may include a memory, a data pattern identification unit and page programming unit. The memory may be capable of storing data of a first of a plurality of page programming operations. The data pattern identification unit may be configured to identify a data pattern from the stored data. The page programming unit may be configured to program first data from among the data in a first multi-bit cell according to the identified data pattern by varying a threshold voltage of the first multi-bit cell by a first amount, and program second data from among the data in a second multi-bit cell by varying a threshold voltage of the second multi-bit cell by a second amount. The first and second multi-bit cells may be different.

At least one other example embodiment provides a multi-bit programming method. According to at least this example embodiment, first data of a page programming operation may be stored in a data buffer and a number of '1's and '0's from among the first data including at least one bit may be counted. Whether an inversion of the first data occurs may be determined based on the number of '1's and '0's, and the second data may be generated from the first data according to the determined occurrence of the inversion. The second data may be stored to replace the first data in the page buffer. The second data stored in the page buffer may be programmed in at least one multi-bit cell.

At least one other example embodiment provides a multi-bit programming method. According to at least this method, first data of a page programming operation may be stored in a data buffer. The first data may include at least one bit. A number of bits having a first value and a number of bits having a second value among the first data may be counted. Whether to invert the first data may be determined based on the number of bits having a first value and the number of bits having the second value. The first data may be inverted to generate the second data if the number of bits having a first value is greater than the number of bits having a second value. The first data may be replaced with the second data in the page buffer. The second data stored in the page buffer may be programmed in at least one multi-bit cell.

At least one other example embodiment provides a multi-bit programming method. According to at least this example embodiment, data used in a page programming operation may be stored. A data pattern may be identified from among the data, and a threshold voltage of a first multi-bit cell corresponding to the identified data pattern may be varied by a first amount. A threshold voltage of a second multi-bit cell except for the first multi-bit cell may be varied by a second amount.

At least one other example embodiment provides a multi-bit programming method. According to at least this example embodiment, data used in a plurality of page programming operations may be stored, and a data pattern from among the data may be identified. A threshold voltage of a first multi-bit cell may be varied according to the identified data pattern by a first amount. A threshold voltage of a second multi-bit cell may be varied by a second amount. The first and second multi-bit cells may be different.

At least one other example embodiment provides a computer-readable recording medium storing a computer executable instructions that, when executed, cause a computer to perform a multi-bit programming method. In this method, data used in a plurality of page programming operations may be stored, and a data pattern from among the data may be identified. A threshold voltage of a first multi-bit cell may be varied according to the identified data pattern by a first amount. A threshold voltage of a second multi-bit cell may be varied by a second amount. The first and second multi-bit cells may be different.

At least one other example embodiment provides a computer-readable recording medium storing a computer executable instructions that, when executed, cause a computer to perform a multi-bit programming method. In this method, data used in a page programming operation may be stored. A data pattern may be identified from among the data, and a threshold voltage of a first multi-bit cell corresponding to the identified data pattern may be varied by a first amount. A threshold voltage of a second multi-bit cell except for the first multi-bit cell may be varied by a second amount.

According to at least some example embodiments, the first value may be 1 or 0 and the second value may be 1 or 0, wherein the first and second values being different. The input control unit may determine whether to invert the first data for each of the plurality of page programming operations. The input control unit determines whether to invert the first data based on first data of each of the plurality of page programming operations. The input control unit may determine whether to invert the first data based on the number of bits having the first value and the number of bits having the second value and an order of each of the plurality of page programming operations. The order may be a natural number from 1 to N. According to at least some example embodiments, the first value may be '1' and the second value may be '0', and the page programming operation is an (N−1)th page programming operation among the plurality of page programming operations. The first value may be '0' and the second value may be '1', and the page programming operation is the N-th page programming operation among the plurality of page programming operations.

According to at least some example embodiments, the multi-bit programming apparatus may further include a flag storage unit configured to store a flag indicating whether the first data has been inverted. The output control unit may be configured to receive the flag from the flag storage unit, receive the second data from the multi-bit cell, and recover the first data from the second data based on the flag. The page programming operation may change a threshold voltage of the at least one multi-bit cell. The input control unit may determine whether to invert the first data based on the number of bits having the first value, the number of bits having the second value and an amount of change in the threshold voltage of the at least one multi-bit cell while performing the first page programming operation.

According to at least some example embodiments, the input control unit may determine whether to invert the first data such that a maximum amount of change in the threshold voltage of the at least one multi-bit cell is minimized. The multi-bit programming apparatus may perform N page programming operations. When performing an (N−1)th page programming operation, the input control unit may determine whether to invert the first data such that a number of multi-bit cells in which a threshold voltage varies is greater than a number of multi-bit cells in which the threshold voltage does not vary.

The multi-bit programming apparatus may perform N page programming operations, and when performing the N-th page programming operation, the input control unit may determine whether to invert the first data such that the number of multi-bit cells in which a threshold voltage varies increases. The input control unit may determine whether to invert the first data such that a number of multi-bit cells in which a threshold voltage varies is greater than a number of multi-bit cells in which the threshold voltage does not vary while performing the page programming operation. The multi-bit programming apparatus may perform N page programming operation, and the input control unit may determine whether the inversion of the first data occurs such that a number of multi-bit cells in which a first threshold voltage varies increases while performing the first page programming operation, and such that a number of multi-bit cells in which a second threshold voltage does not vary increases while performing the first page programming operation, the second threshold voltage being greater than the first threshold voltage.

BRIEF DESCRIPTION OF THE DRAWINGS

The present invention will become apparent and more readily appreciated from the following detailed description of example embodiments, taken in conjunction with the accompanying drawings of which:

FIG. 13 is an operation flowchart illustrating a multi-bit programming method according to another example embodiment.

DETAILED DESCRIPTION OF EXAMPLE EMBODIMENTS

Figure 1:
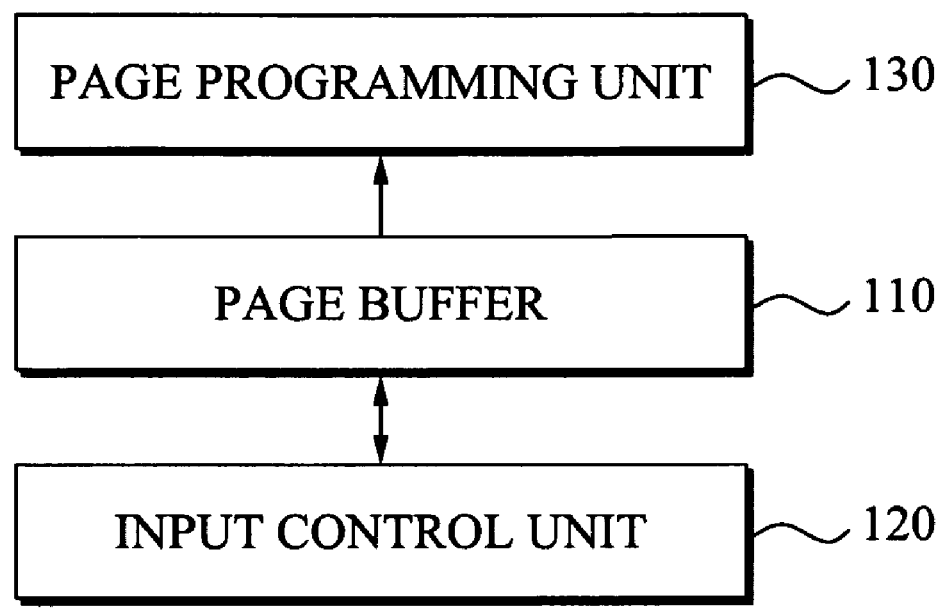
FIG. 1 is a diagram illustrating a multi-bit programming apparatus according to an example embodiment.

Detailed example embodiments are disclosed herein. However, specific structural and functional details disclosed herein are merely representative for purposes of describing example embodiments. Example embodiments may, however, be embodied in many alternate forms and should not be construed as limited to only the embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but to the contrary, example embodiments are to cover all modifications, equivalents, and alternatives falling within the scope of example embodiments. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Reference will now be made in detail to example embodiments illustrated in the accompanying drawings, wherein like reference numerals refer to the like elements throughout. The example embodiments are described below in order to explain the present invention by referring to the figures. In some instances, well-known features are omitted to prevent cumbersome descriptions of the present invention.

FIG. 1 is a diagram illustrating a multi-bit programming apparatus according to an example embodiment.

Referring to FIG. 1, a multi-bit programming apparatus 100 may include a page buffer 110, an input control unit (or circuit) 120 and a page programming unit (or circuit) 130.

The page buffer 110 may store first data of a page programming operation. The first data may include at least one bit. The input control unit 120 may determine whether an inversion of the first data has occurred based on a number of '1's and '0's included in the first data. The input control unit 120 may generate second data based on whether inversion of bits in the first data has occurred (e.g., occurrence/nonoccurrence of bit-inversion), and store the generated second data in the page buffer 110.

When the input control unit 120 determines that inversion of the first data has occurred, the input control unit 120 may invert the first data to generate second data. When the input control unit 120 determines that inversion of the first data has not occurred, the input control unit 120 maintains the first data to generate second data. In one example, the input control unit 120 may not invert the first data to generate the second data. In this example, the first data and the second data are the same. According to at least some example embodiments, bit-inversion or inverting bits may refer to changing bits from a first value (e.g., '0' or '1') to a different value (e.g., '0' or '1').

The page programming unit 130 may program or write the second data stored in the page buffer 110 in at least one multi-bit cell.

Figure 2:
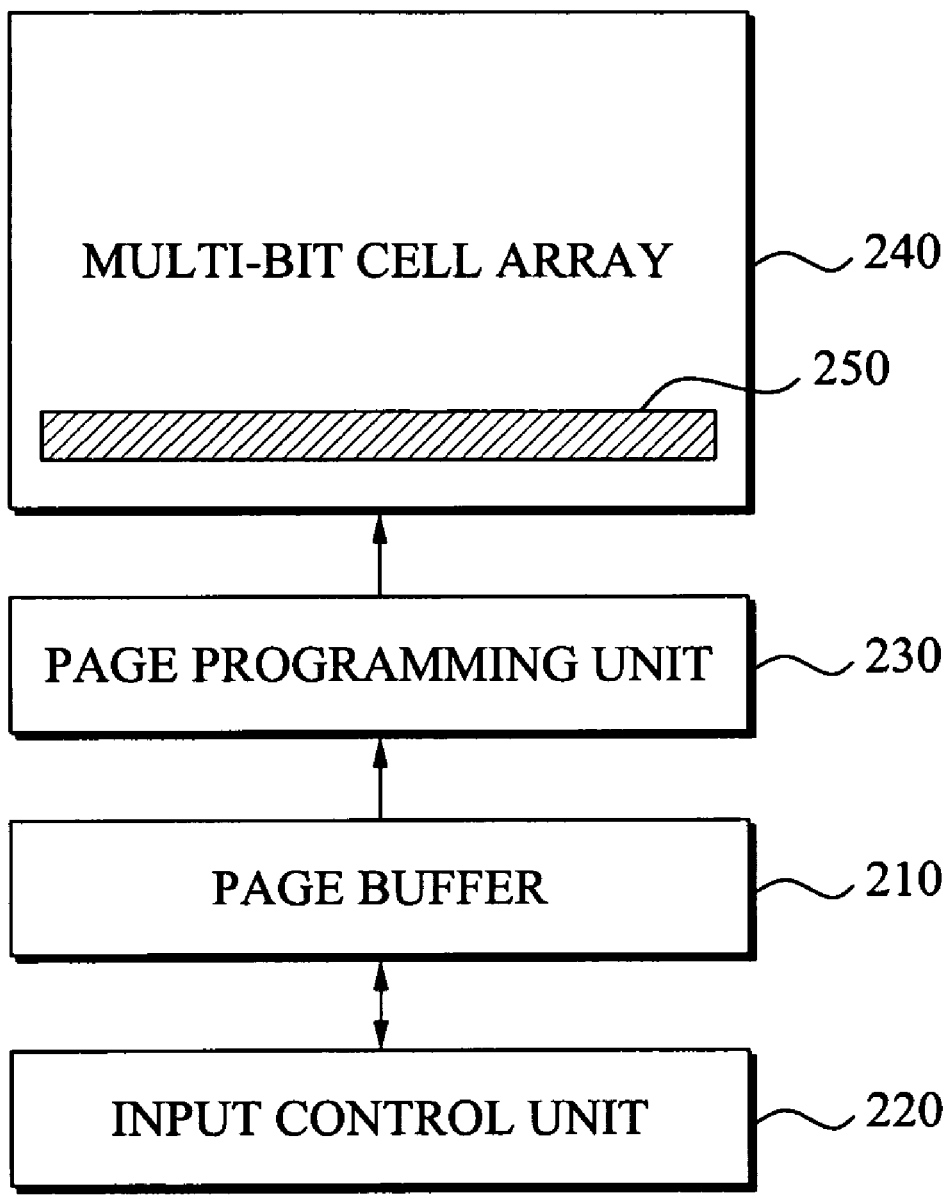
FIG. 2 is a diagram illustrating a multi-bit programming apparatus according to another example embodiment.

FIG. 2 is a diagram illustrating a multi-bit programming apparatus according to another example embodiment.

Referring to FIG. 2, a multi-bit programming apparatus 200 may include a page buffer 210, an input control circuit (or unit) 220, a page programming circuit (or unit) 230 and a multi-bit cell array 240.

The page buffer 210 may store first data of a page programming operation performed by the multi-bit programming apparatus 200. The first data may include a plurality of (e.g., N) bits. The multi-bit programming apparatus 200 may perform the page programming operation N times, where N is an integer. The page buffer 210 may store first data for each current page programming operation, wherein each page programming operation may correspond to one-bit data. According to at least one example embodiment, a first page programming operation may include programming a first bit, a second page programming operation may include programming a second bit, etc.

A page programming operation performed N times by the multi-bit programming apparatus 200 may generate or program multi-bit (e.g., N-bit) data in each of one or more multi-bit cells.

Each page programming operation may include a plurality of unit programming operations. A number of times the unit programming operation is performed (e.g., N) may be determined based on a programming algorithm.

Alternatively, the number of times the unit programming operation is performed may be determined using a method according to an example embodiment, which will be discussed in more detail below.

When a unit programming operation is complete, the multi-bit programming apparatus 200 may detect a threshold voltage of each multi-bit cell. The multi-bit programming apparatus 200 may compare the detected threshold voltage of each multi-bit cell with a reference voltage to determine whether a subsequent unit programming operation need be performed for each multi-bit cell based on results of the comparison.

According to at least this example embodiment, the unit programming operation increases a threshold voltage of a multi-bit cell. In one example, if a threshold voltage of a first multi-bit cell is determined to be less than the reference voltage based on the comparison results, the multi-bit programming apparatus 200 may perform a subsequent unit programming operation with respect to the first multi-bit cell. If a threshold voltage of a second multi-bit cell is determined to be greater than or equal to the reference voltage based on the comparison results, the multi-bit programming apparatus 200 may not perform a subsequent unit programming operation with respect to the second multi-bit cell.

The input control unit 220 may determine whether an inversion of the first data has occurred based on a number of '1's and '0's included in the first data. The input control unit 220 may generate second data based on whether inversion of the first data has occurred (e.g., the determined occurrence/nonoccurrence of the inversion). The input control unit 220 may overwrite the generated second data replacing the first data in the page buffer 210.

The input control unit 220 may determine whether inversion of first data has occurred for each page programming operation. When determining whether inversion of first data has occurred for each page programming operation, the input control unit 220 may consider at least a portion (e.g., all or selected first data of page programming operations of N times).

In this example, the page programming operation may have an order from 1 to N because of performing of the page programming operation of N times. When determining whether inversion of first data of (N−1)th page programming operation has occurred, the input control unit 220 may consider all or substantially all first data of each of N page programming operations (e.g., from the first to N-th page programming operation).

The input control unit 220 may determine whether an inversion of first data occurs based on a number of '1's and '0's and the order of a current page programming operation. For example, the input control unit 220 may determine whether inversion of the first data of the (N−1)th page programming operation has occurred based on a number of '1's and '0's among the first data and the order of the (N−1)th page programming operation.

The page programming unit 230 may program the generated second data stored in the page buffer 210 in a page 250 of the multi-bit cell array 240. The page 250 may include a plurality of multi-bit cells connected via at least one (e.g., a single) word line. The number of multi-nit cells in page 250 may include be the same as the number of bits of first data.

When the number of '1's is greater than the number of '0's, in the first data of the (N−1)th page programming operation, the input control unit 220 may invert the first data of the (N−1)th page programming operation to generate second data. Otherwise, the input control unit 220 may not invert the first data of the (N−1)th page programming operation to generate the second data. In this case, the first and second data may be the same.

When the number of '0's is greater than the number of '1's, from among the first data of the N-th page programming operation, the input control unit 220 may invert the first data of the N-th page programming operation to generate second data. Otherwise, the input control unit 220 may not invert the first data of the N-th page programming operation to generate the second data. In this case, the first and second data may be the same.

Figure 3:
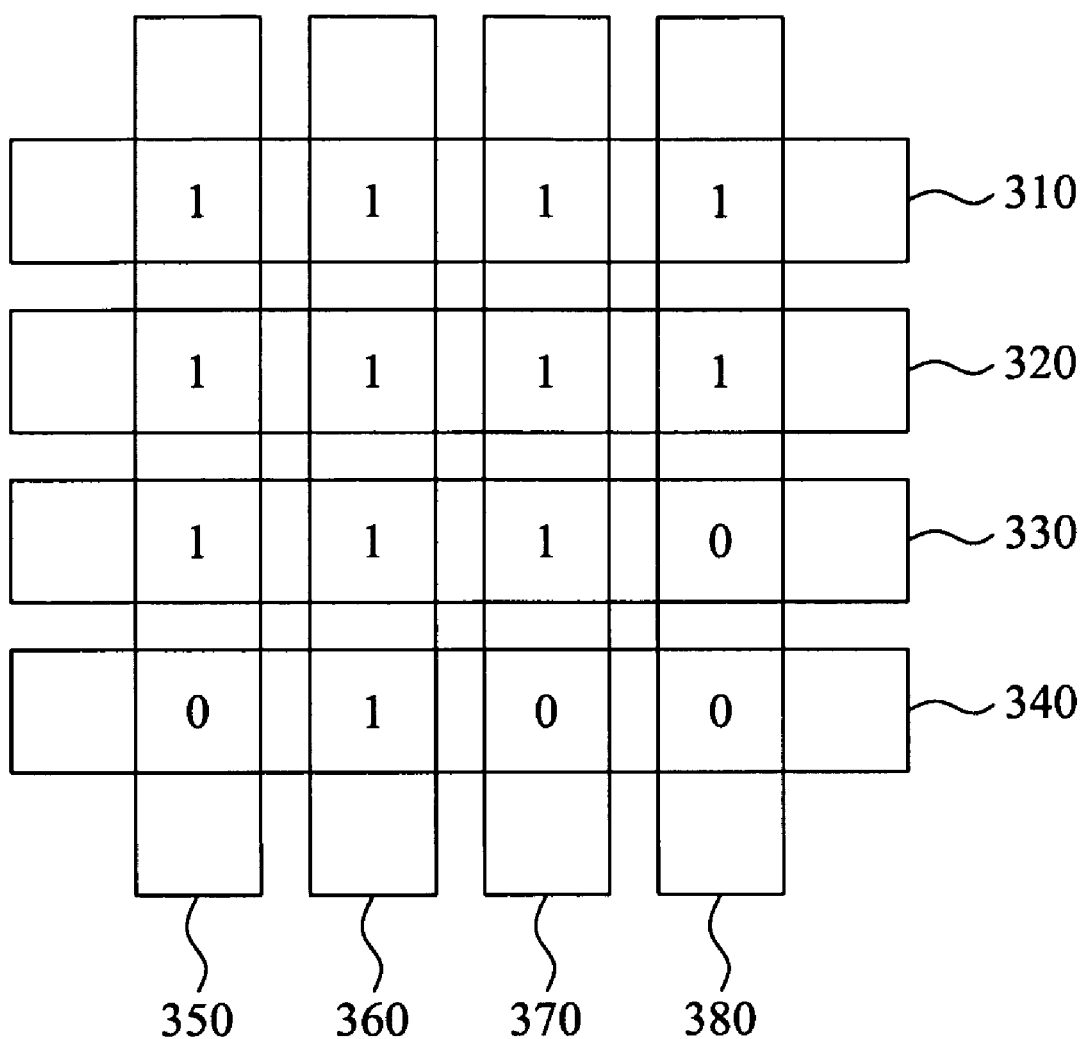
FIGS. 3 and 4 are diagrams illustrating a process where an input control unit performs an inversion of first data when a page programming operation is performed four times according to an example embodiment.
Figure 4:
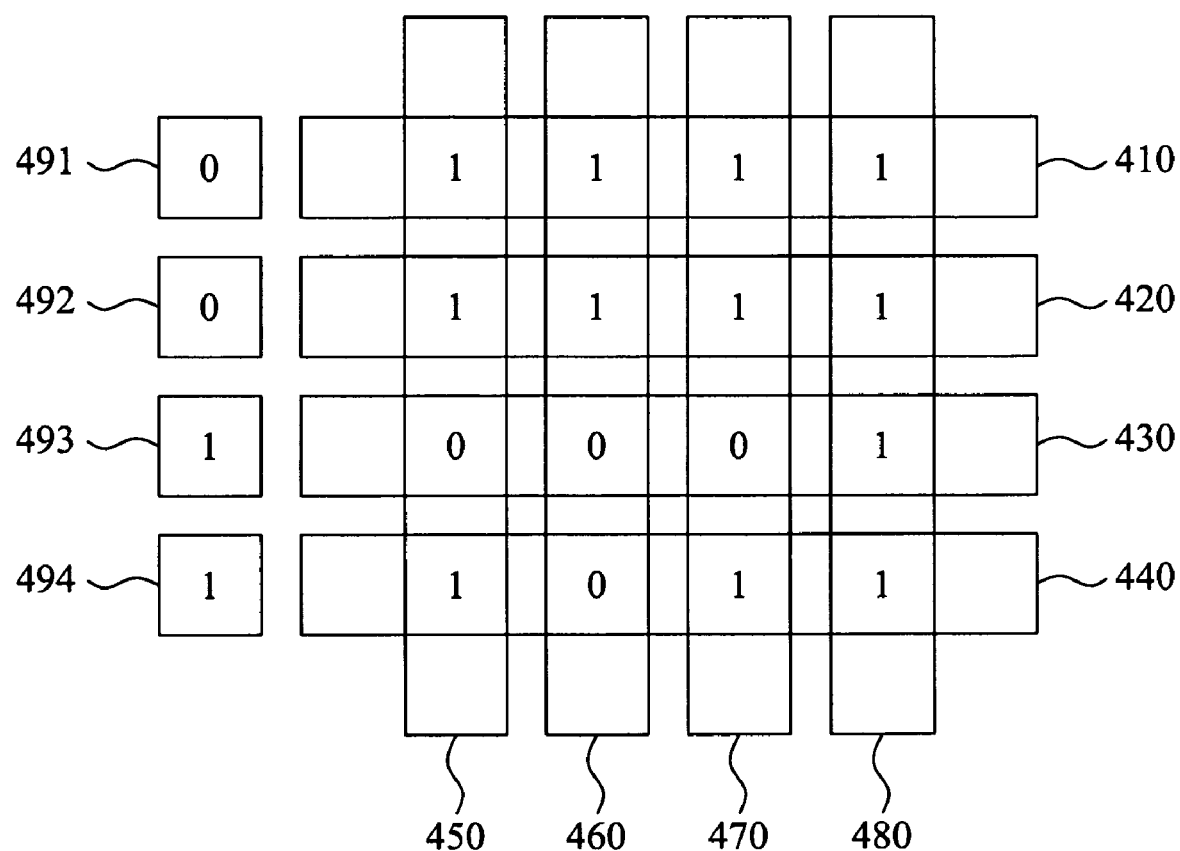

FIGS. 3 and 4 are diagrams illustrating a process in which an input control unit 220 may invert first data. The example shown in FIGS. 3 and 4 is described herein with respect to a page programming operation performed four times, however, example embodiments are not limited thereto. The diagrams shown in FIGS. 3 and 4 will be discussed with regard to FIG. 2.

Referring to FIGS. 3 and 4, data 310 represents first data of a first page programming operation, data 410 represents second data of the first page programming operation.

The input control unit 220 may generate the data 410 based on the data 310, and the input control unit 220 may store the generated data 410 in the page buffer 210. In this example, the input control unit 220 may overwrite the data 310 by replacing the data 310 stored in the page buffer 210 with the data 410.

The page buffer 210 may be a static random access memory (SRAM) or the like (e.g., a memory functioning in a manner similar or substantially similar to an SRAM). When the page buffer 210 stores K-bit data (where K is, e.g., 1, 2, 4, 8, 16, 32, etc.), the page programming unit 230 may simultaneously or concurrently program K-bit data in the page 250. In this example, the page 250 may include K multi-bit cells.

FIGS. 3 and 4 are described with regard to a page buffer 210 capable of storing 4-bit data. However, example embodiments are not limited to this example, but instead may be implemented in conjunction with any size multi-bit page buffer.

Referring to FIGS. 3 and 4, the page buffer 210 may store the 4-bit data, and thus, the page 250 may include a 4-bit cell. The page programming unit 230 may simultaneously or concurrently program the 4-bit data in the page 250.

The data 410 may be programmed in the page 250 by the page programming unit 230 during the first page programming operation.

A first-bit of the data 410 may be programmed in a first multi-bit cell of the page 250, a second-bit of the data 410 may be programmed in a second multi-bit cell of the page 250, etc.

In FIG. 4, data column 450 denotes multi-bit data programmed in the first multi-bit cell, data column 460 denotes multi-bit data programmed in the second multi-bit cell.

Among data programmed in a single multi-bit cell, data programmed during the first page programming operation may be the most significant bit (MSB), and data programmed during the fourth page programming operation may be the least significant bit (LSB).

As illustrated in FIGS. 3 and 4, multi-bit data programmed in the first multi-bit cell is '1011' (data column 450, from bottom to top). When the above-described page programming operation is not performed by the multi-bit programming apparatus according to this example embodiment, the multi-bit data programmed in the first multi-bit cell is '0111' (data column 350 of FIG. 3, from bottom to top).

Referring still to FIGS. 3 and 4, data 320 represents first data of a second page programming operation, and data 420 represents second data of the second page programming operation.

The input control unit 220 may generate the data 420 based on the data 320, and the input control unit 220 may store the generated data 420 in the page buffer 210. In this example, the input control unit 220 may overwrite the data 320 by replacing the data 320 stored in the page buffer 210 with the data 420.

The page programming unit 230 may program the data 420 in the page 250 during the second page programming operation.

The input control unit 220 may not invert the first data 310 and the first data 320 of the first and second page programming operations. As illustrated in FIGS. 3 and 4, the data 410 may be the same or substantially the same as the data 310, and the data 420 may be the same or substantially the same as the data 320.

Referring still to FIGS. 3 and 4, data 330 represents first data of a third page programming operation, and data 430 represents second data of the third page programming operation. The input control unit 220 may generate the data 430 based on the data 330, and the input control unit 220 may store the generated data 430 in the page buffer 210. In this example, the input control unit 220 may overwrite the data 330 by replacing the data 330 stored in the page buffer 210 with the data 430.

The page programming unit 230 may program the data 430 stored in the page buffer 210 in the page 250 during the third page programming operation.

In this case, the input control unit 220 may determine whether a page programming operation currently performed is an (N−1)th page programming operation. In this example, because N is '4', the input control unit 220 determines the currently performed page programming operation is the (N−1)th or third page programming operation. Accordingly, the input control unit 220 may count a number of '1's and '0's from among the data 330, for example. If the input control unit 220 determines that the number of '1's is greater than the number of '0's in the data 330, the input control unit 220 may invert the data 330 to generate the data 430. As shown in FIG. 3, because the data 330 includes three '1's and one '0', the input control unit 220 inverts the data 330 ('1110') to generate the data 430 ('0001').

The multi-bit programming apparatus 200 may generate a flag 493 based on whether the second data is an inverted version of the first data (e.g., based on the occurrence/nonoccurrence of inversion of the data 330). In the example shown in FIG. 4, a flag 493 having a value of '1' indicates the data 330 has been inverted to generate the data 430. Still referring to FIG. 4, a flag 491 having a value '0' indicates that the data 310 has not been inverted to generate the data 410. Similarly, flag 492 has a value '0' indicating that the data 320 has not been inverted to generate data 420.

Still referring to FIGS. 3 and 4, data 340 represents first data of a fourth page programming operation and data 440 represents second data of the fourth page programming operation. The input control unit 220 may generate the data 440 based on the data 340. The input control unit 220 may store the generated data 440 in the page buffer 210 by overwriting the data 340 stored in the page buffer 210 with the data 440. The page programming unit 230 may program the data 440 stored in the page buffer 210 in the page 250 during the fourth page programming operation.

The input control unit 220 may determine whether a current page programming operation is an N-th page programming operation. According to this example, because N is '4', the input control unit 220 determines that the current page programming operation is the N-th page programming operation. Accordingly, the input control unit 220 may count a number of '1's and '0's in the data 340. When the number of '0's is greater than the number of '1's in the data 340, the input control unit 220 may invert the data 340 to generate the data 440. In the example shown in FIG. 3, the data 340 includes one '1' and three '0's, and thus, the input control unit 220 inverts the data 340 to generate the data 440. Because the data 440 is an inverted version of the data 340, the multi-bit programming apparatus 200 sets the flag 494 to a value of '1'.

The flags 491, 492, 493 and 494 may be stored in a flag storage unit (or circuit), which may also be included within the multi-bit programming apparatus 200.

Still referring to FIG. 4, when the N page programming operation is complete, '1011' is programmed in the first multi-bit cell (data column 450), '0011' is programmed in the second multi-bit cell (data column 460), '1011' is programmed in a third multi-bit cell (data column 470), and '1111' is programmed in a fourth multi-bit cell (data column 480).

When the above-described page programming operation is not performed by the multi-bit programming apparatus 200 according to example embodiments, the data columns 350, 360, 370 and 380 denote data programmed in the multi-bit cells of the page 250.

The multi-bit programming apparatus 200 according to at least this example embodiment may reduce the case in which '0111' is programmed in a multi-bit cell. Problems of the case where '0111' is programmed in a single multi-bit cell will be described in detail with reference to FIG. 6.

As illustrated in FIG. 3, '0111' may be programmed in the first multi-bit cell and the third multi bit cell. However, in the multi-bit programming apparatus 200 according to example embodiments, second data may be programmed by inverting the first data, and thus, '1011' may be programmed in the first multi-bit cell and the third multi-bit cell.

Figure 5:
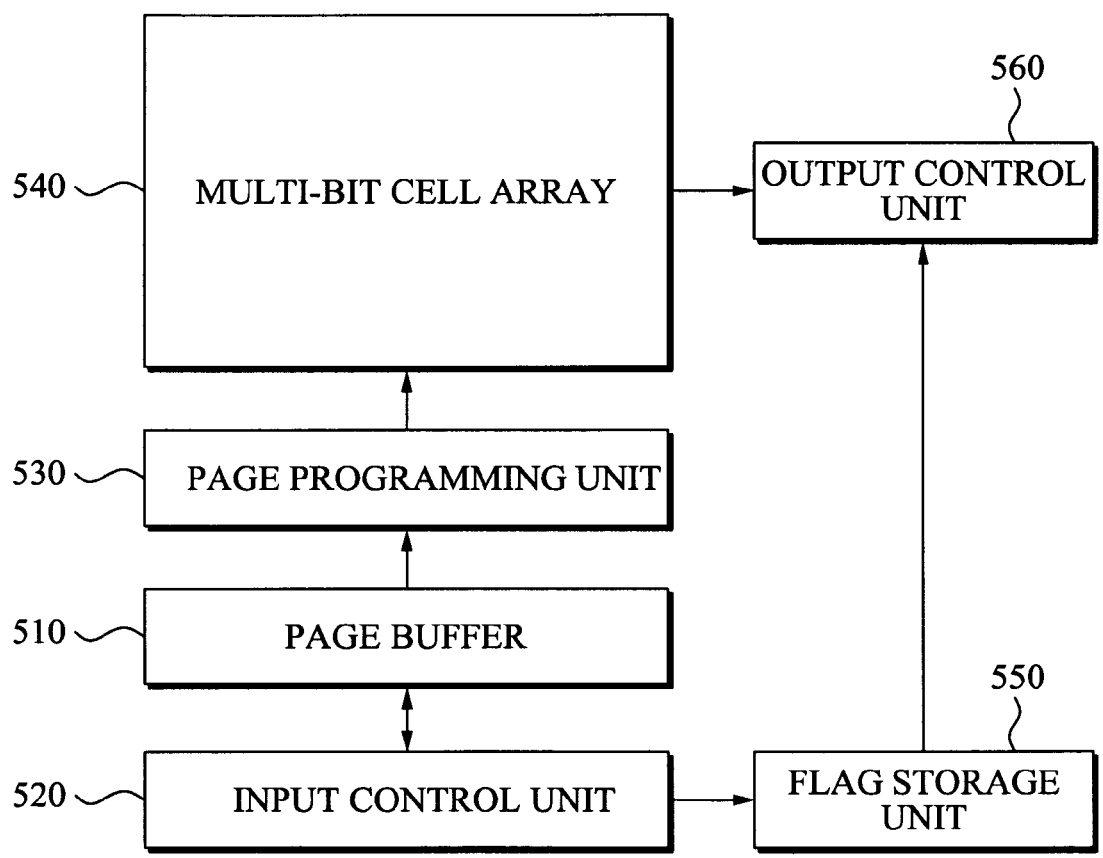
FIG. 5 is a diagram illustrating a multi-bit programming apparatus according to another example embodiment.

FIG. 5 is a diagram illustrating a multi-bit programming apparatus 500 according to another example embodiment.

Referring to FIG. 5, the multi-bit programming apparatus 500 may include a page buffer 510, an input control unit 520, a page programming unit 530, a multi-bit cell array 540, a flag storage unit 550 and an output control unit 560.

Operations of the page buffer 510, the input control unit 520, the page programming unit 530 and the multi-bit cell array 540 may be performed in the same or substantially the same manner as those illustrated in FIGS. 1 and 2, and thus, detailed descriptions thereof will be omitted for the sake of brevity.

The flag storage unit 550 may store a flag corresponding to occurrence/nonoccurrence of first data of a page programming operation. The flags stored in the flag storage unit 550 may indicate whether second data of a page programming operation is an inverted version of the corresponding first data of the page programming operation. For example, when second data is an inverted version of corresponding first data, the flag storage unit 550 may generate and store a flag in a first logic state (e.g., '1'). When the second data is not an inverted version of (e.g., is the same as) the corresponding first data, the flag storage unit 550 may generate and store a flag in a second logic state (e.g., '0').

The flag storage unit 550 may also store an address of a multi-bit cell where second data may be programmed, as necessary, while performing the page programming operation. The address of the multi-bit cell may include transverse coordinates and vertical coordinates indicating locations of multi-bit cells within a multi-bit cell array 540.

The output control unit 560 may receive a flag from the flag storage unit 550 and second data from the multi-bit cell. The output control circuit 560 may restore first data from the second data based on the flag. For example, when the received flag is in the first logic state (e.g., '1'), the output control unit 560 may invert the received second data to recover the first data. Conversely, when the received flag is in the second logic state (e.g., '0'), the output control unit 560 may recover the first data without inverting the second data.

Although discussed herein with regard to the first logic state being '1' and the second logic state being '0', values of these logic states are interchangeable, wherein the first logic state may be '0', and the second logic state may be '1'.

A page programming operation may vary a threshold voltage of the multi-bit cell in which the second data is programmed.

The input control unit 520 may determine whether the second data is an inverted version of the first data based on a number of '1's and '0's among the first data and an amount of change in the threshold voltage of the multi-bit cell while performing the page programming operation.

Figure 6:
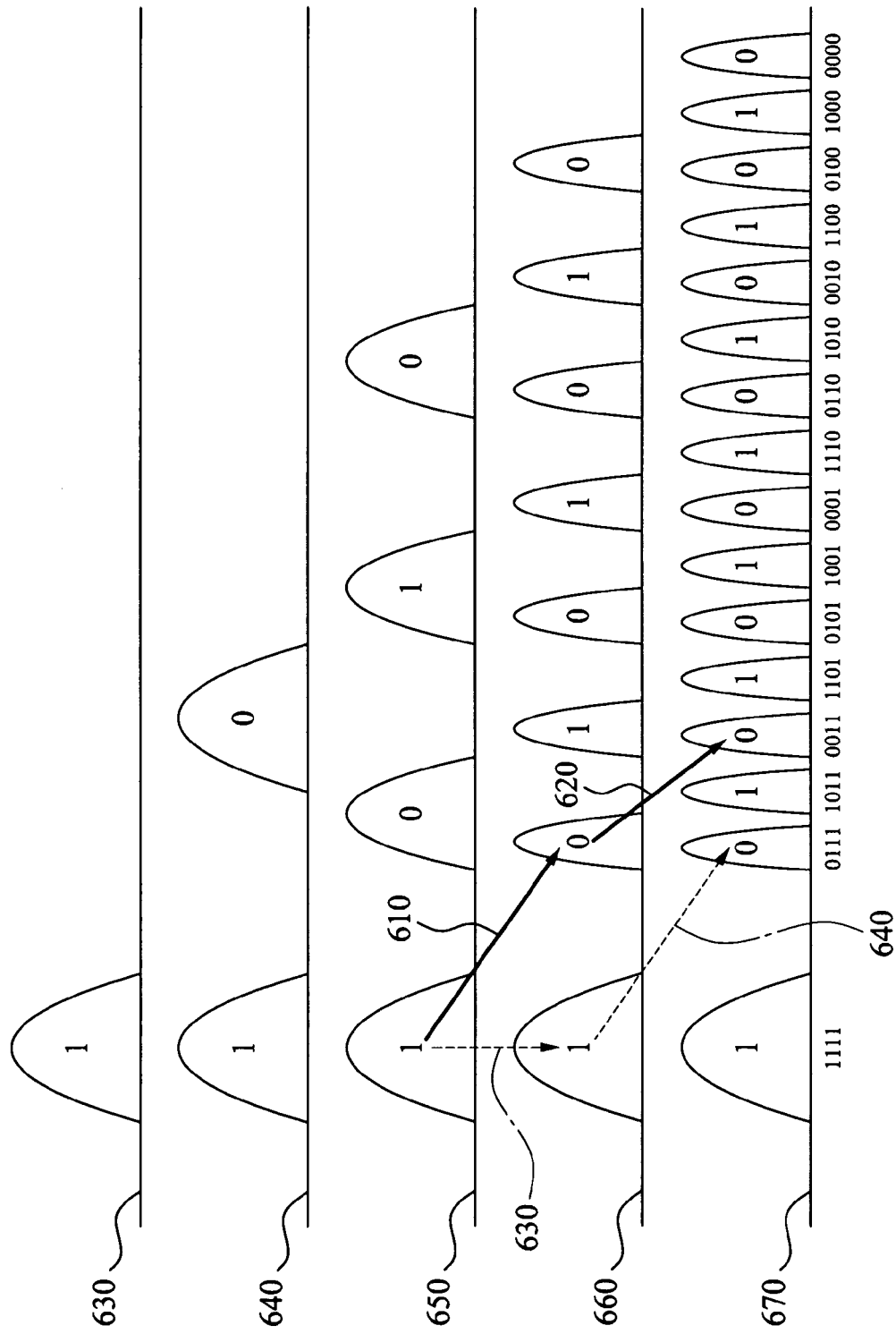
FIG. 6 is a diagram illustrating an example of page programming operations performed by the multi-bit programming apparatus of FIG. 5.

FIG. 6 is a diagram illustrating an example of page programming operations performed by the multi-bit programming apparatus 500 of FIG. 5.

Referring to FIG. 6, at distribution 630, a multi-bit cell is in an initial state before performing a programming operation. Transverse axes illustrated in FIG. 6 indicate a threshold voltage of a multi-bit cell, and vertical axes indicate a distribution of the multi-bit cell.

At distribution 640, a multi-bit cell in which '1111' is programmed may be maintained in the initial state, while performing the page programming operation multiple (e.g., four) times. Still referring to distribution 640, when performing a first page programming operation, a multi-bit cell in which '1' is programmed may be maintained in the initial state, and a multi-bit cell in which '0' is programmed may transition from the initial state to a state 'XXX0'. In this example, 'X' denotes an undefined logic state or "don't care" state.

At distribution 650, when performing a second page programming operation, the multi-bit cell in which '1' is programmed may be either maintained in the initial state or transition from a state 'XXX0' to a state 'XX10'. Also, at distribution 650, when performing the second page programming operation, the multi-bit cell where '0' is programmed may transition from either the initial state to a state 'XX01', or from a state 'XXX0' to a state 'XX00'.

A distribution of multi-bit cells after performing a third page programming operation is illustrated at distribution 660, and distribution 670 illustrates a distribution of multi-bit cells after performing a fourth page programming operation. As illustrated in distribution 670, the case where '1111' transitions to '0111' (612 in FIG. 6) has a larger (e.g., the largest) amount of change in the threshold voltage of the multi-bit cells.

According to example embodiments, when the amount of change in the threshold voltage of the multi-bit cells increases while performing the page programming operation, unnecessary changes may be created due to influences of threshold voltages of neighboring multi-bit cells or other characteristics during or after performing the page programming operation. Examples of these influences are floating poly-silicon (FP) coupling, a program disturbance, and the like.

Floating poly-silicon (FP) coupling may vary the threshold voltages of neighboring multi-bit cells, and expand a distribution of the threshold voltage of corresponding multi-bit cells. When the distribution of the threshold voltage expands, an error rate occurring in a process for reading data of the multi-bit cell may increase. Therefore, to suppress FP coupling, for example, the multi-bit programming apparatus 500 according to the at least this example embodiment may reduce a maximum amount of change in the threshold voltage of the multi-bit cell such that the increase in the threshold voltage is suppressed while performing the page programming operation, or a number of multi-bit cells in which the maximum amount of change in the threshold voltage occurs may be decreased.

As shown from operation 614 in FIG. 6, the multi-bit cells maintained in the initial state after performing a third page programming operation may be transferred from the initial state to a state '0111' while performing a fourth page programming operation (operation 612).

When a number of '1's is greater than a number of '0's from among first data of the third page programming operation, the input control unit 520 may invert the first data of the third page programming operation to generate the second data.

In this regard, a number of the multi-bit cells transferred from the initial state to a state 'X011' in operation 610 may be greater than a number of the multi-bit cells maintained in the initial state (denoted by operation 614). As a result, a number of multi-bit cells transition to the state '0111', in operation 612, may be reduced.

Thus, in the input control unit 520, a maximum amount of change in the threshold voltage of multi-bit cells may be reduced (e.g., minimized), or a number of multi-bit cells in which the maximum amount of change in the threshold occurs may be reduced.

The input control unit 520 may determine whether an inversion of first data occurs, so that a number of multi-bit cells, from among the at least one multi-bit cell, in which a threshold voltage varies is greater than a number of multi-bit cells in which the threshold voltage does not vary, while performing the (N-1)th page programming operation.

As illustrated in FIG. 6, if N is 4, the input control unit 520 may compare a number of '1's with a number of '0's in second data during a third page programming operation to determine whether inversion of the data has occurred. When inversion occurs, the number of '0's is greater than the number of '1's in the second data. When the number of '0's is greater than the number of '1's in the second data, the number of multi-bit cells in which the threshold voltage varies is greater than the number of multi-bit cells in which the threshold voltage does not vary.

The input control unit 520 may increase a number of multi-bit cells transitioning from 'XX11' to 'X001' such that the number of multi-bit cells transitioning from 'XX11' to 'X011' is greater than a number of multi-bit cells transitioning from 'XX11' to 'X111', thereby reducing (e.g., minimizing) data corruption caused by FP coupling, for example.

The input control unit 520 may generate second data without inverting the first data of a fourth page programming operation. At operation 620, multi-bit cells in which the first data of the fourth page programming operation is '0' may transition from 'X011' to '0011'.

According to example embodiments, the input control unit 520 may determine whether inversion of the first data occurs, so that multi-bit cells in which a threshold voltage does not vary may increase while performing an N-th page programming operation. When N is 4, for example, the input control unit 520 may compare a number of '1's with a number of '0's among the second data during the fourth page programming operation to determine whether inversion of the first data occurs. When the number of '1's is greater than the number of '0's from among the second data, the number of multi-bit cells in which the threshold voltage does not vary may be greater than the number of multi-bit cells in which the threshold voltage varies.

The input control unit 520 may increase a number of multi-bit cells transitioning from 'X111' to '0111' such that the number of multi-bit cells transitioning from 'X111' to '0111' is greater than a number of multi-bit cells transitioned from 'X111' to '1111', thereby reducing (e.g., minimizing) data corruption caused by FP coupling, for example.

Figure 7:
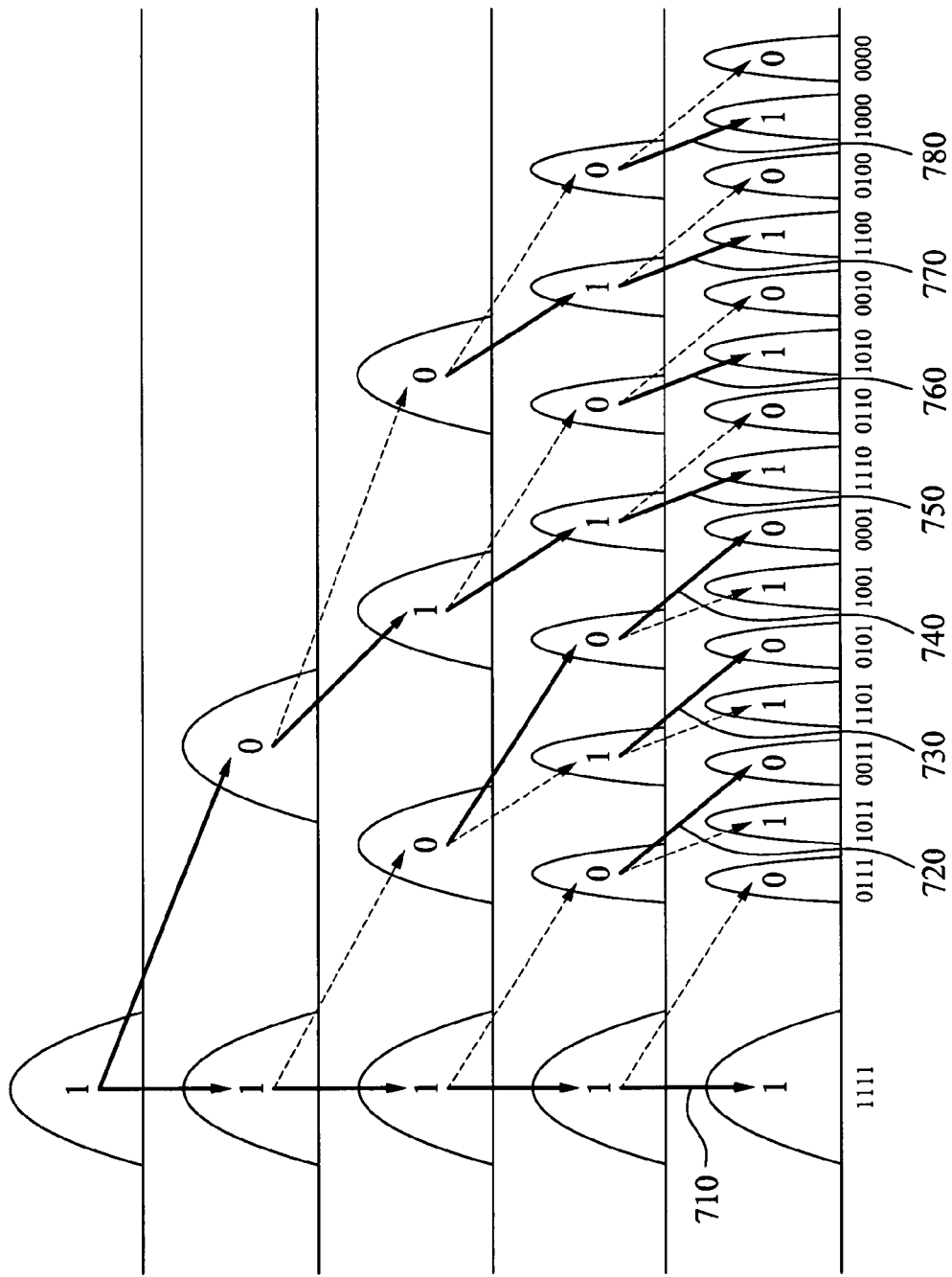
FIG. 7 is a diagram illustrating another example of page programming operations performed by the multi-bit programming apparatus of FIG. 5.

FIG. 7 is a diagram illustrating another example of page programming operations performed by a multi-bit programming apparatus (e.g., multi-bit programming apparatus 500 of FIG. 5), according to an example embodiment.

Referring to FIG. 7, the input control unit 520 may determine whether inversion of first data occurs based on whether a number of multi-bit cells located in a progress direction of solid-line arrows is greater than a number of multi-bit cells located in a progress direction of dotted-line arrows.

According to example embodiments, unnecessary changes in the threshold voltage of multi-bit cells caused by FP coupling and/or data corruption may occur (e.g., remarkably exhibited) in multi-bit cells having a smaller or relatively small threshold voltage.

Accordingly, in the case of the multi-bit cells having the smaller or relatively small threshold voltage, the input control unit 520 may determine whether the inversion of the first data of the fourth page programming operation occurs, such that a number of multi-bit cells transitioning from 'X011' to '0011' in operation 720, from 'X101' to '0101' in operation 730, and from 'X001' to '0001' in operation 740 may increase, respectively.

Also, in the case of the multi-bit cells having the smaller or relatively small threshold voltage, the input control unit 520 may determine whether inversion of the first data occurs based on whether a number of multi-bit cells in which the threshold voltage varies is greater than a number of multi-bit cells in which the threshold voltage does not vary.

According to example embodiments, a programming operation of a nonvolatile memory may be performed to increase a threshold voltage, and thus, the change in the threshold voltage while performing the programming operation denotes an increase in the threshold voltage.

Also, in the case of the multi-bit cells having the smaller or relatively small threshold voltage, the input control unit 520 may induce a page programming operation so as to increase the threshold voltage, thereby reducing and/or minimizing data corruption.

In this example embodiment, the input control unit 520 may determine whether the inversion of the first data of the fourth page programming operation, so that a number of multi-bit cells transitioning from 'X111' to '0111' may be reduced, and a number of multi-bit cells transitioning from 'X111' to '1111' may increase.

The data corruption caused by FP coupling may be shown (e.g., remarkably exhibited) in the multi-bit cells transitioning from 'X111' to '0111'. In the case of the remaining transfer processes other than a transfer process in which the multi-bit cells transition from 'X111' to '0111', when a number of multi-bit cells in which the threshold voltage is relatively small increases, a distribution of the threshold voltage may expand.

Accordingly, the input control unit 520 may reduce the number of multi-bit cells transitioned to '0111', and in the case of the remaining transfer processes other than the transfer process in which the multi-bit cells transition to '0111', the input control unit 520 may also reduce the number of multi-bit cells in which the threshold voltage is smaller or relatively small, thereby reducing and/or minimizing the data corruption caused by FP coupling and/or the expansion of the distribution of the threshold voltage.

According to example embodiments, a relatively high voltage may be applied to a gate terminal of multi-bit cells to increase the threshold voltage of the multi-bit cells. When a potential difference between the gate terminal and a drain/source/bulk terminal increases, the threshold voltage of multi-bit cells adjacent to a target multi-bit cell may be affected (e.g., adversely affected) due to a program disturbance occurring in the programming process, and thereby data corruption may be disadvantageously generated.

Also, exposure (e.g., prolonged exposure) of multi-bit cells to the relatively high voltage while performing the page programming operation may result in characteristic change due to high voltage stress (HVS).

Accordingly, a number of multi-bit cells in which a threshold voltage approximates an upper limit of a voltage window may be reduced while performing a page programming operation, thereby reducing and/or minimizing data corruption.

The input control unit 520 may determine whether inversion of the first data of the fourth page programming operation occurs, such that a number of multi-bit cells transferred from 'X110' to '1110' in operation 750, from 'X010' to '1010' in operation 760, from 'X100' to '1100' in operation 770, and from 'X000' to '1000' in operation 780 may increase, respectively.

The input control unit 520 may reduce a number of multi-bit cells in which the threshold voltage is relatively larger, thereby reducing and/or minimizing data corruption.

The input control unit 520 may determine whether inversion of the first data occurs based on a number of multi-bit cells, from among multi-bit cells having a first threshold voltage smaller than that of '0001', in which a first threshold voltage increases.

The input control unit 520 may determine whether inversion of the second data occurs based on a number of multi-bit cells, from among multi-bit cells having a second threshold voltage greater than that of '1110', in which a second threshold voltage increases.

Figure 8:
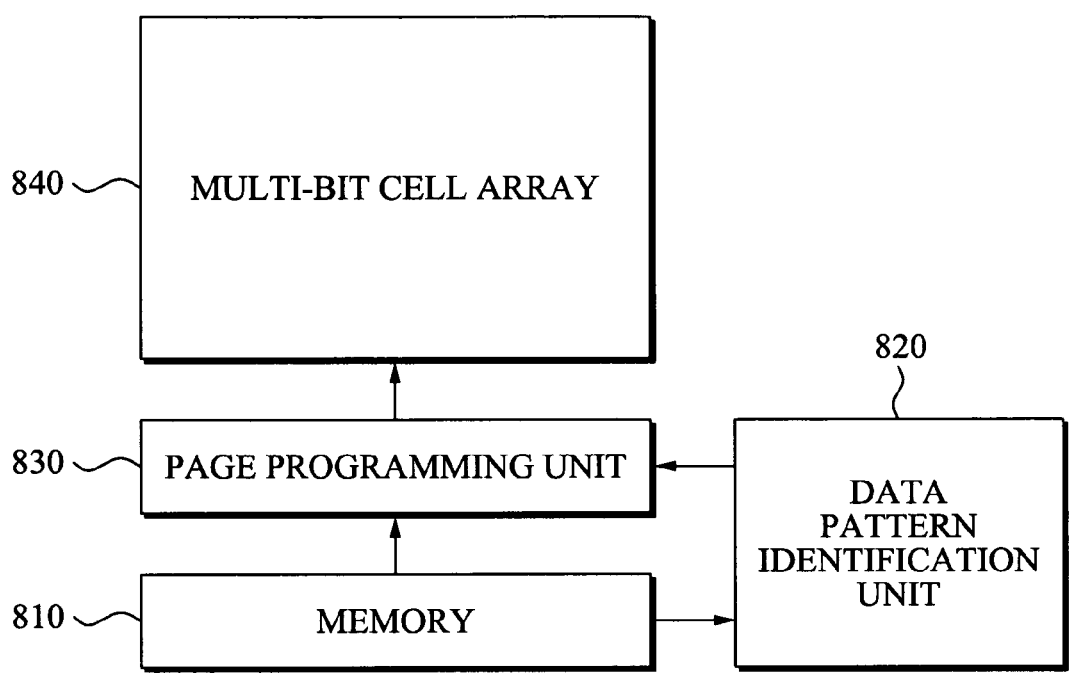
FIG. 8 is a diagram illustrating a multi-bit programming apparatus according to another example embodiment.

FIG. 8 is a diagram illustrating a multi-bit programming apparatus according to another example embodiment.

Referring to FIG. 8, a multi-bit programming apparatus 800 may include a memory 810, a data pattern identification unit (or circuit) 820, a page programming unit (or circuit) 830, and a multi-bit cell array 840.

The multi-bit programming apparatus 800 may perform a page programming operation multiple (e.g., N) times, and the memory 810 may store data of each of the N page programming operations. The data pattern identification unit 820 may identify a data pattern from among the data stored in the memory 810.

The page programming unit 830 may program first data from among the stored data in a first multi-bit cell by varying a threshold voltage of the first multi-bit cell by a first amount. The first amount may correspond to the identified data pattern. In this example, the first data refers to data programmed in the first multi-bit cell.

The page programming unit 830 may program second data in a second multi-bit cell by varying a threshold voltage of a second multi-bit cell by a second amount. The second data refers to the remaining data, not the first data, among the stored data. The multi-bit cell array 840 may be an array including the first multi-bit cell and the second multi-bit cell.

Figure 9:
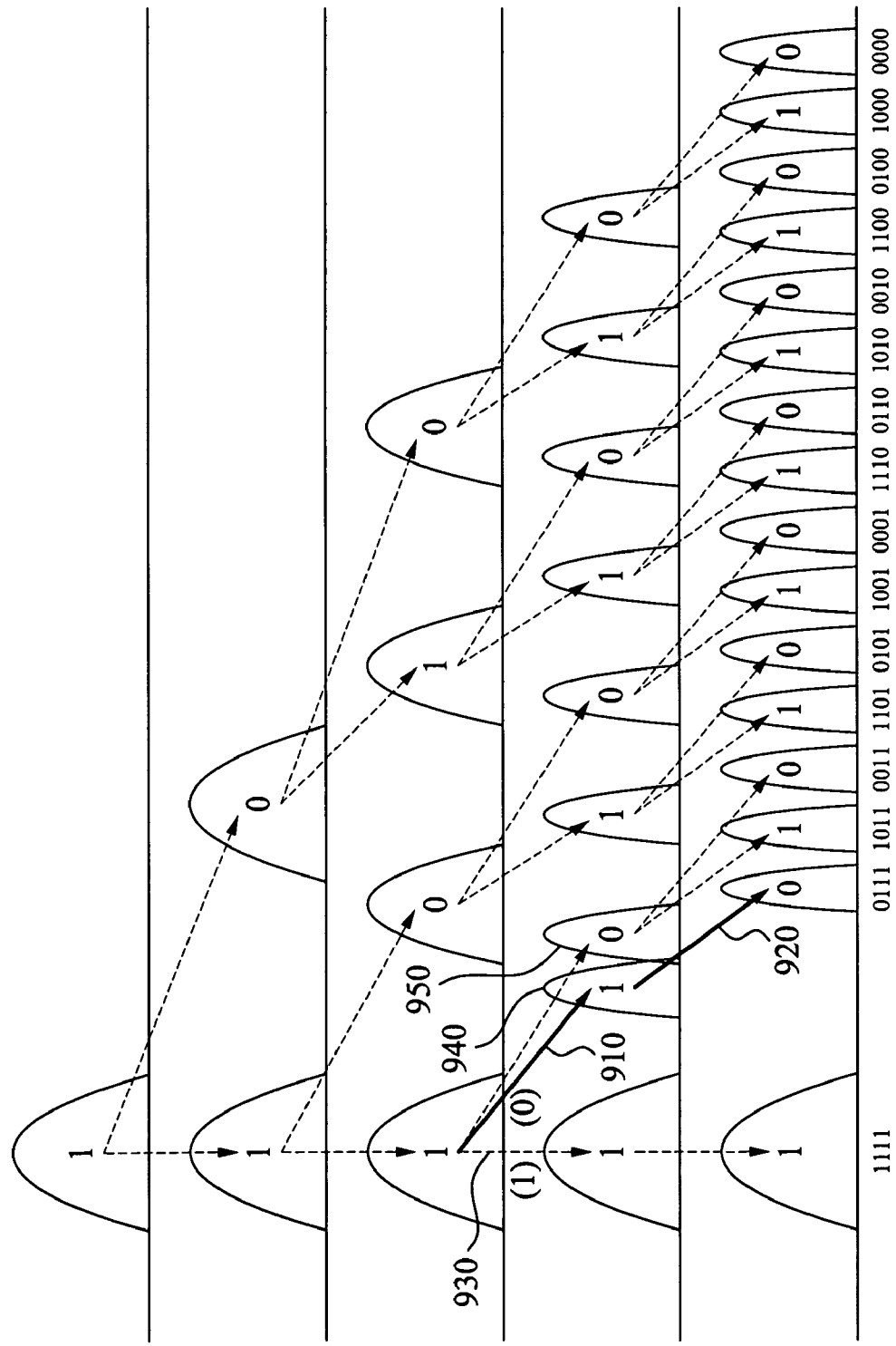
FIG. 9 is a diagram illustrating page programming operations performed by the multi-bit programming apparatus of FIG. 8.

FIG. 9 is a diagram illustrating example page programming operations performed by the multi-bit programming apparatus 800 of FIG. 8.

As illustrated in FIG. 9, N is 4, however, example embodiments are not limited thereto. Example embodiments may be implemented in conjunction with any number N (e.g., 1, 2, 4, 8, 16, etc.).

Referring to FIG. 9, multi-bit cells in a state '0111' after a page programming operation is performed four times may be obtained through a transition operation 910 and a transition operation 920.

The data pattern identification unit 820 may analyze the data stored in the memory 810, and identify multi-bit cells in the state '0111' after the page programming operation is performed four times.

In this example, if the data pattern is '0111', the data pattern identification unit 820 may analyze all data during the four page programming operations, and identify the data pattern.

Multi-bit cells having the data pattern '0111' may be classified as first multi-bit cells. The remaining multi-bit cells may be classified as second multi-bit cells.

The page programming unit 830 may program the first data in the first multi-bit cells according to transition operation 910 during a third page programming operation. When performing the transition operation 910, a threshold voltage of the first multi-bit cells may vary by a first amount. When performing the transition operation 910, the first multi-bit cells may transition from a state 'XX11' to a state 'X111' at a state 940.

The page programming unit 830 may vary a threshold voltage of the second multi-bit cells by a second amount while performing a third page programming operation, and thus, the second data may be programmed in the second multi-bit cells.

The page programming unit 830 may program the first data in the first multi-bit cells according to a transition operation 920 while performing a fourth page programming operation. When performing the transition operation 920, the threshold voltage of the first multi-bit cells may vary by a third amount. When performing the transition operation 920, the first multi-bit cells may transition from the state 'X111' at the state 940 to a state '0111'.

The page programming unit 830 may vary the threshold voltage of the second multi-bit cells by a fourth amount while performing the fourth page programming operation, and thus, the second data may be programmed in the second multi-bit cells.

According to the multi-bit programming apparatus 800, in the transition process where the first multi-bit cells transition from the state 'X111' to the state '0111', change in the threshold voltage may be generated during the third and fourth page programming operations.

Accordingly, the threshold voltage of the first multi-bit cells may change while performing the third page programming operation, which may differ from the fourth page programming operation. In this regard, data corruption of adjacent multi-bit cells occurring due to the change in the threshold voltage may be compensated for during the fourth page programming operation.

The multi-bit programming apparatus 800 may disperse the change in the threshold voltage of the first multi-bit cells while performing a plurality of page programming operations, thereby reducing (e.g., substantially reducing and/or minimizing) the data corruption caused by FP coupling, for example.

The multi-bit programming apparatus 800 may determine a distribution of the threshold voltage of the first and second multi-bit cells, respectively, unlike the conventional art, thereby reducing (e.g., substantially reducing and/or minimizing) the data corruption caused by FP coupling, for example.

According to at least this example embodiment, the transition operation 910 may be performed while performing the third page programming operation, and the transition operation 920 may be performed while performing the fourth page programming operation. As a result, a total number of programming operations may not increase, which may suppress and/or prevent data corruption resulting from programming disturbances.

According to at least this example embodiment, final data stored in the first multi-bit cells may not be inverted. Accordingly, even when the data stored in the first multi-bit cells is read, recovering initial data may not be required.

According to another example embodiment, the page programming unit 830 may invert the first data programmed during the third page programming operation, and program the inverted first data in the first multi-bit cells. The first data may correspond to the data pattern '0111'. The page programming unit 830 may invert the first data (e.g., transition bits having a logic value '1' to a logic value '0' and vice versa) programmed during the third page programming operation to generate '0', and may program the generated '0' in the first multi-bit cells.

Because the page programming unit 830 programs '0' in the first multi-bit cells while performing the third page programming operation, the threshold voltage of the first multi-bit cells may vary without a separate, additional circuit.

The first multi-bit cells may transition from the state 'XX11' to the state 'X111' at the state 940 during the third page programming operation. A transition operation 930 with respect to second multi-bit cells corresponding to a pattern of '1111' from among multi-bit cells being in the state 'XX11' may be performed during the third page programming operation.

According to another example embodiment, the state 'X111' at the state 940 may be physically the same or substantially the same as the state 'X011' at state 950. The page programming unit 830 may divide the state '0111' and '1011' by varying the third amount and the fourth amount while performing the fourth page programming operation. In a more specific example, the page programming unit 830 may divide the state '0111' and the state '1011' by increasing the fourth amount such that the fourth amount is greater than the third amount. In this example, the state 'X111' at the state 940 may be physically the same or substantially the same as the state 'X011'. However, the state 'X111' may be logically different from the state 'X011', for example, if the state 'X111' at the state 940 is associated with the first multi-bit cells, and the state 'X011' is associated with the second multi-bit cells.

According to another example embodiment, the multi-bit programming apparatus 800 may invert the first data programmed while performing the third page programming operation, and store the inverted first data in the memory 810. The page programming unit 830 may receive the inverted first data from the memory 810 while performing third page programming operation, and program the received first data in the first multi-bit cells.

Figure 10:
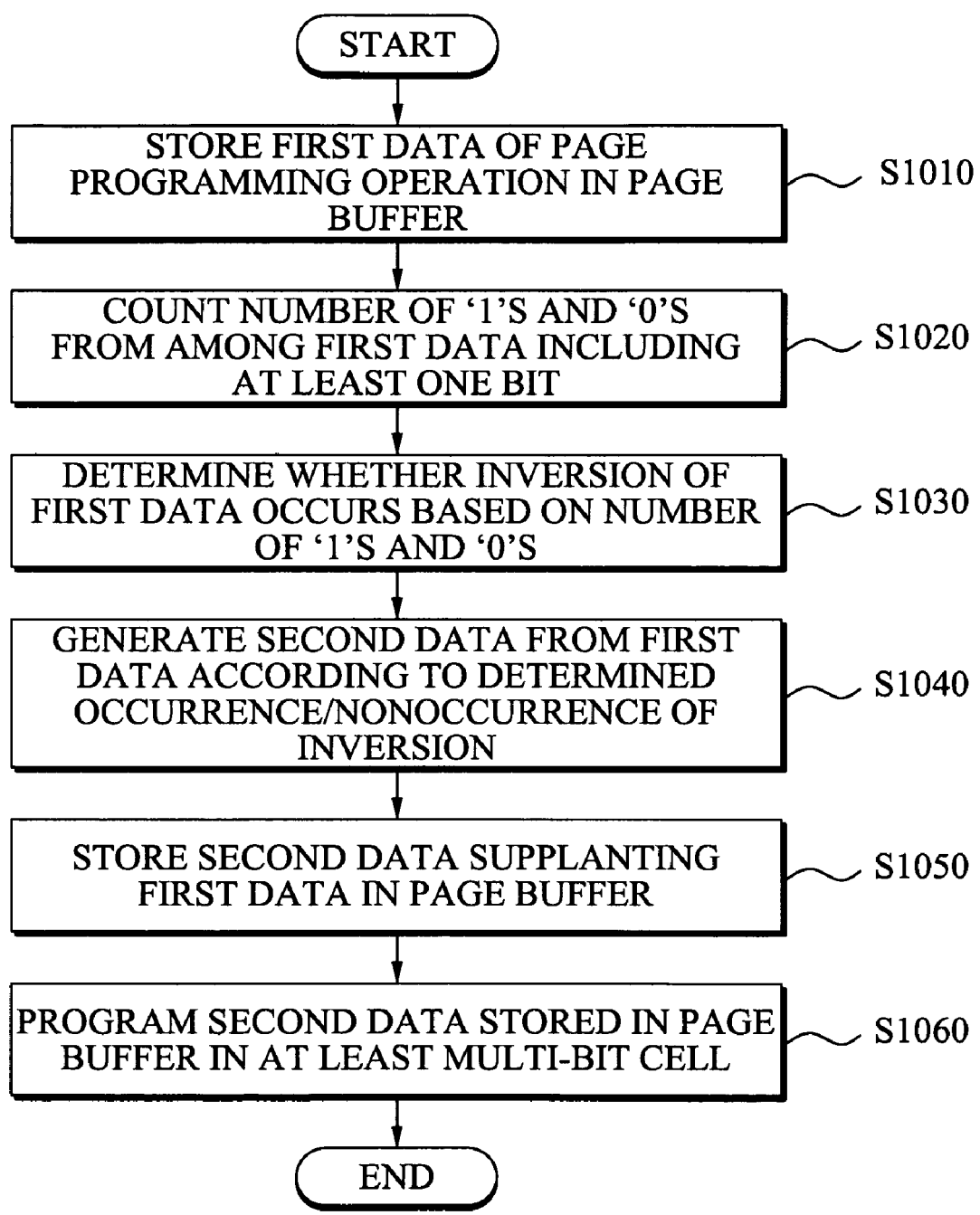
FIG. 10 is an operation flowchart illustrating a multi-bit programming method according to an example embodiment.

FIG. 10 is a flowchart illustrating a multi-bit programming method according to an example embodiment.

Referring to FIG. 10, at S1010, the first data of a page programming operation may be stored in a page buffer. At S1020, a number of '1's and '0's in the first data including at least one bit may be counted. At S1030, whether inversion of the first data is necessary may be determined based on the number of '1's and '0's among the first data.

At S1040, second data may be generated based on the first data according to whether inversion is determined to be necessary. At S1050, the second data may be stored, thereby replacing the first data in the page buffer. At S1060, the second data stored in the page buffer may be programmed in at least one multi-bit cell. The page programming operation described above may be performed N times.

At S1030, whether inversion of the first data is necessary may be determined based on an order of page programming operation. The order of page programming operation may have a natural number from 1 to N.

Figure 11:
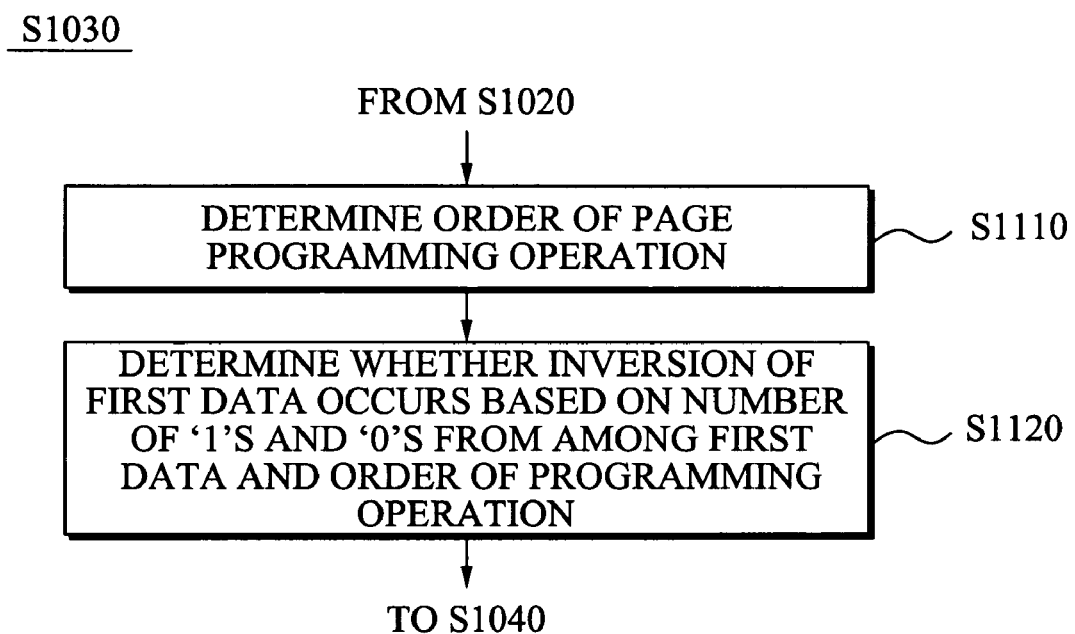
FIG. 11 is an operation flowchart illustrating, in detail, an example embodiment of operation S1030 of FIG. 10.

FIG. 11 is a flowchart illustrating an example embodiment of S1030 in FIG. 10.

Referring to FIG. 11, at S1110, the order of page programming operation may be determined.

Figure 12:
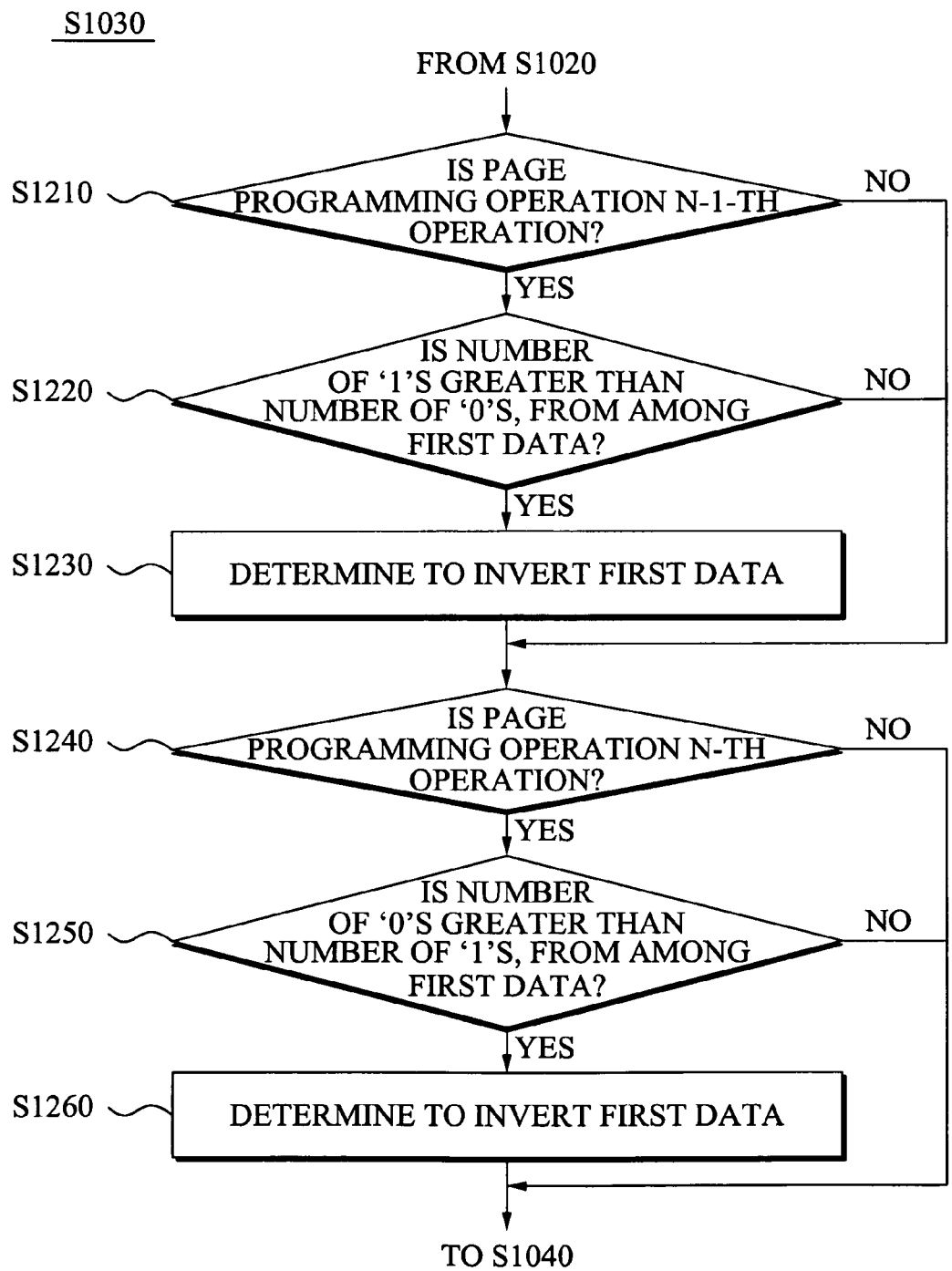
FIG. 12 is an operation flowchart illustrating, in detail, another example embodiment of operation S1030 of FIG. 10.

At S1120, whether inversion of the first data is necessary may be determined based on the number of '1's and '0's from among the first data and an order of a current page programming operation. FIG. 12 is a flowchart illustrating another example embodiment of S1030 in FIG. 10.

Referring to FIG. 12, at S1210, whether the current page programming operation is an (N−1)th page programming operation may be determined. If the current page programming operation is the (N−1)th page programming operation, whether the number of '1's is greater than the number of '0's among the first data of the page programming operation may be determined at S1220.

If the current page programming operation is the (N−1)th page programming operation, and the number of '1's is greater than the number of '0's from among the first data of the page programming operation, inversion of the first data is deemed to be necessary at S1230, and the first data may be inverted.

At S1240, whether the current page programming operation is the N-th page programming operation may be determined. If the current page programming operation is the N-th page programming operation, whether the number of '0's is greater than the number of '1's among the first data of the page programming operation may be determined at S1250.

If the current page programming operation is the N-th page programming operation, and the number of '0's is greater than the number of '1's from among the first data, inversion of the first data is deemed to be necessary at S1260, and the first data may be inverted. The method may then proceed to S1040, and continues as discussed above with regard to FIG. 10.

Returning to S1250, if the number of '0's is less than or equal to the number of '1's from among the first data, the process proceeds to S1040 of FIG. 10 and continues as discussed above.

Returning to S1240, if the current programming operation is determined not to be the N-th page programming operation, the process proceeds to S1040 of FIG. 10 and continues as discussed above.

Returning to S1220, if the current page programming operation is the (N−1)th page programming operation, but the number of '1's is not less than or equal to the number of '0's from among the first data of the page programming operation, the process proceeds to S1240 and continues as discussed above.

Returning to S1210, if the current page programming operation is not the (N−1)th page programming operation, the process proceeds to S1240, and continues as discussed above.

According to another example embodiment, the page programming operation may program data in multi-bit cells by varying a threshold voltage of the multi-bit cells.

According to another example embodiment, the page programming operation may increase the threshold voltage of the multi-bit cells in the case of programming data of '0'.

Multi-bit programming methods according to example embodiments may reduce a number of multi-bit cells in which the threshold voltage varies or substantially varies, thereby reducing (e.g., substantially reducing or minimizing) the data corruption caused by FP coupling, for example.

FIG. 13 is a flowchart illustrating a multi-bit programming method according to another example embodiment.

Referring to FIG. 13, at S1310, data used in N page programming operations may be stored. At S1320, a data pattern from among the data may be identified. At S1330, a threshold voltage of a first multi-bit cells corresponding to the identified data pattern may be varied by a first amount. At S1330, the first data from among the data in the first multi-bit cells may be programmed by varying the threshold voltage of the first multi-bit cells by the first amount. At S1340, a threshold voltage of second multi-bit cells, but not the first multi-bit cells, may be varied by a second amount. At S1340, the second data from among the data in the second multi-bit cells may be programmed by varying the threshold voltage of the second multi-bit cells by the second amount. The second data denotes the remaining data, except for the first data from among the data.

In this example, a data pattern may be associated with multi-bit data programmed in the first multi-bit cells or the second multi-bit cells.

According to another example embodiment, the data pattern may be associated with the case where the multi-bit data programmed the first multi-bit cell or the second multi-bit cell is '0111'. According to another example embodiment, the multi-bit programming method may further include inverting the first data. In this example, the multi-bit programming method may perform operation S1330 using the inverted first data.

As described above, according to this example embodiment, the multi-bit programming method may not increase a total number of programming operations, thereby reducing and/or minimizing data corruption caused by a programming disturbance. Also, the multi-bit programming method according to this example embodiment may access data stored in the first multi-bit cells without performing an additional process for recovering the data stored in the first multi-bit cells.

According to at least this example embodiment, the multi-bit programming method may disperse the change (e.g., radical change) in the threshold voltage of the first multi-bit cells while performing a plurality of page programming operations, thereby reducing and/or minimizing data corruption caused by FP coupling, for example.

Multi-bit programming apparatuses and multi-bit programming methods according to example embodiments may determine whether an inversion of a data bit occurs by flexibly utilizing a binary code, a modified binary code, a gray code, a gray-like code, and the like, which are used in a process of performing the page programming operation.

Multi-bit programming methods according to the above-described example embodiments may be recorded in computer-readable media including program instructions to implement various operations embodied by a computer. The media may also include, alone or in combination with the program instructions, data files, data structures, and the like. The media and program instructions may be those specially designed and constructed for the purposes of the present invention, or they may be of the kind well-known and available to those having skill in the computer software arts. Examples of computer-readable media include magnetic media such as hard disks, floppy disks, and magnetic tape; optical media such as CD ROM disks and DVD; magneto-optical media such as optical disks; and hardware devices that are specially configured to store and perform program instructions, such as read-only memory (ROM), random access memory (RAM), flash memory, and the like. Examples of program instructions include both machine code, such as produced by a compiler, and files containing higher level code that may be executed by the computer using an interpreter. The described hardware devices may be configured to act as one or more software modules in order to perform the operations of the above-described example embodiments of the present invention.

Example embodiments provide a multi-level (multi-bit) programming scheme in an MLC memory device, which may control a distribution of a threshold voltage more precisely when storing data. Also, example embodiments provide apparatuses and/or methods that may apply a multi-level (multi-bit) programming scheme in an MLC memory device and thereby reduce change in a threshold voltage caused by FP coupling, for example, which may lead to reduced data corruption of adjacent multi-level cells, and also reduced read failure rate of data stored in the MLC memory device.

Example embodiments also provide apparatuses and/or methods that may apply a multi-level (multi-bit) programming scheme in an MLC memory device and thereby reduce the occurrence of a disturbance when storing data.

Although only some example embodiments have been shown and described, the present invention is not limited to the described examples. Instead, it would be appreciated by those skilled in the art that changes may be made to these example embodiments without departing from the principles and spirit of the invention, the scope of which is defined by the claims and their equivalents.

What is claimed is:

1. A multi-bit programming apparatus for performing a plurality of page programming operations, wherein a first of the page programming operations changes a threshold voltage of the at least one multi-bit cell, the apparatus comprising:
a page buffer configured to store first data of the first of a plurality of page programming operations, the first data including at least one bit;
an input control unit configured to determine whether to invert the first data based on a number of bits having a first value, a number of bits having a second value in the first data and an amount of change in the threshold voltage of the at least one multi-bit cell while performing the first page programming operation, invert the first data to generate second data if the number of bits having the first value is greater than the number of bits having the second value, and store the second data in the page buffer; and
a page programming unit configured to program the second data stored in the page buffer in at least one multi-bit cell.

2. The multi-bit programming apparatus of claim 1, wherein the first value is 1 or 0 and the second value is 1 or 0, the first and second values being different.

3. The multi-bit programming apparatus of claim 1, wherein the input control unit determines whether to invert the first data for each of the plurality of page programming operations.

4. The multi-bit programming apparatus of claim 1, wherein the input control unit determines whether to invert the first data based on first data of each of the plurality of page programming operations.

5. The multi-bit programming apparatus of claim 1, wherein the input control unit also determines whether to invert the first data based on the number of bits having the first value and the number of bits having the second value and an order of each of the plurality of page programming operations, the order being a natural number from 1 to N.

6. The multi-bit programming apparatus of claim 5, wherein the first value is '1' and the second value is '0', and the first page programming operation is an (N−1)th page programming operation among the plurality of page programming operations.

7. The multi-bit programming apparatus of claim 5, wherein the first value is '0' and the second value is '1', and the first page programming operation is the N-th page programming operation among the plurality of page programming operations.

8. The multi-bit programming apparatus of claim 1, further including,
a flag storage unit configured to store a flag indicating whether the first data has been inverted.

9. The multi-bit programming apparatus of claim 8, further including,
an output control unit configured to receive the flag from the flag storage unit, receive the second data from the multi-bit cell, and recover the first data from the second data based on the flag.

10. The multi-bit programming apparatus of claim 1, wherein the input control unit determines whether to invert the first data such that a maximum amount of change in the threshold voltage of the at least one multi-bit cell is minimized.

11. The multi-bit programming apparatus of claim 1, wherein the multi-bit programming apparatus performs N page programming operations, and when performing an (N−1)th page programming operation, the input control unit determines whether to invert the first data such that a number of multi-bit cells in which a threshold voltage varies is greater than a number of multi-bit cells in which the threshold voltage does not vary.

12. The multi-bit programming apparatus of claim 1, wherein the multi-bit programming apparatus performs N page programming operations, and when performing an N-th page programming operation, the input control unit determines whether to invert the first data such that the number of multi-bit cells in which a threshold voltage varies increases.

13. The multi-bit programming apparatus of claim 1, wherein the input control unit determines whether to invert the first data such that a number of multi-bit cells in which a threshold voltage varies is greater than a number of multi-bit cells in which the threshold voltage does not vary while performing the first page programming operation.

14. The multi-bit programming apparatus of claim 1, wherein the multi-bit programming apparatus performs N page programming operation, and the input control unit determines whether to invert the first data such that a number of multi-bit cells in which a first threshold voltage varies increases while performing the first page programming operation, and such that a number of multi-bit cells in which a second threshold voltage does not vary increases while performing the first page programming operation, the second threshold voltage being greater than the first threshold voltage.

15. A multi-bit programming method, the method comprising:
 storing first data of a page programming operation in a data buffer, wherein the page programming operation changes a threshold voltage of the at least one multi-bit cell, and wherein the first data includes at least one bit;
 counting a number of bits having a first value and a number of bits having a second value among the first data;
 determining whether to invert the first data based on the number of bits having a first value, the number of bits having the second value and an amount of change in the threshold voltage of the at least one multi-bit cell while performing the page programming operation;
 inverting the first data to generate the second data so that a maximum amount of change in the threshold voltage of the at least one multi-bit cell is minimized;
 replacing the first data with the second data in the page buffer; and
 programming the second data stored in the page buffer in at least one multi-bit cell.

16. The multi-bit programming method of claim 15, wherein the page programming operation is one of N page programming operations being ordered from 1 to N, and the determining determines whether to invert the first data based on an order of the page programming operation.

* * * * *